United States Patent [19]
Orcutt

[11] Patent Number: 5,925,927
[45] Date of Patent: Jul. 20, 1999

[54] REINFORCED THIN LEAD FRAMES AND LEADS

[75] Inventor: John Orcutt, Richardson, Tex.

[73] Assignee: Texas Instruments Incoporated, Dallas, Tex.

[21] Appl. No.: 08/991,725

[22] Filed: Dec. 16, 1997

Related U.S. Application Data

[XX .
[60] Provisional application No. 60/034,299, Dec. 18, 1996.

[51] Int. Cl.⁶ .......................... H01L 23/52; H01L 23/495; H01L 23/50; H01L 23/48
[52] U.S. Cl. .......................... 257/674; 257/775; 257/698; 257/696; 257/669; 257/666; 438/123
[58] Field of Search ........................... 257/666, 669–674, 257/690, 642, 698, 773, 774, 696; 438/123, 106

[56] References Cited

U.S. PATENT DOCUMENTS

| | | | |
|---|---|---|---|
| 4,920,074 | 4/1990 | Shimizu et al. | 257/692 |
| 5,195,014 | 3/1993 | Krantz, Jr. et al. | 361/111 |
| 5,521,426 | 5/1996 | Russell | 257/666 |
| 5,541,565 | 7/1996 | Dowsing, III et al. | 257/666 |
| 5,585,670 | 12/1996 | Isshiki et al. | 257/691 |
| 5,586,009 | 12/1996 | Burns | 257/692 |
| 5,776,802 | 7/1998 | Ochi et al. | 438/123 |

FOREIGN PATENT DOCUMENTS

| | | | |
|---|---|---|---|
| 59-150439 | 8/1984 | Japan | 257/692 |
| 59-181039 | 10/1984 | Japan | 257/674 |
| 61-170965 | 8/1986 | Japan | 257/692 |
| 62-9655 | 1/1987 | Japan | 257/674 |
| 62-219646 | 9/1987 | Japan | 257/674 |
| 63-15455 | 1/1988 | Japan | 257/674 |
| 1-208852 | 8/1989 | Japan | 257/692 |
| 3-1563 | 1/1991 | Japan | 257/697 |
| 4-199558 | 4/1992 | Japan | 257/661 |
| 4-134852 | 5/1992 | Japan | 257/666 |

*Primary Examiner*—Alexander Oscor Williams
*Attorney, Agent, or Firm*—Wade James Brady, III; Richard L. Donaldson

[57] ABSTRACT

A lead frame, method of making same and semiconductor package containing the lead frame. The semiconductor package includes the lead frame which includes an essentially flat, planar lead frame body and lead frame leads extending from the lead frame body, the lead frame leads extending partially out of the plane of the lead frame body. A semiconductor chip is disposed on the lead frame and an encapsulant encapsulates the lead frame body, the semiconductor chip and a portion of the lead frame leads, with a portion of the lead frame leads extending external to the encapsulant. The two dimensional cross section can be essentially in the shape of a "U", essentially sinusoidal in shape, the sinusoidal shape having an odd number of half cycles of the sinusoidal shape or essentially in the shape of a "W".

9 Claims, 1 Drawing Sheet

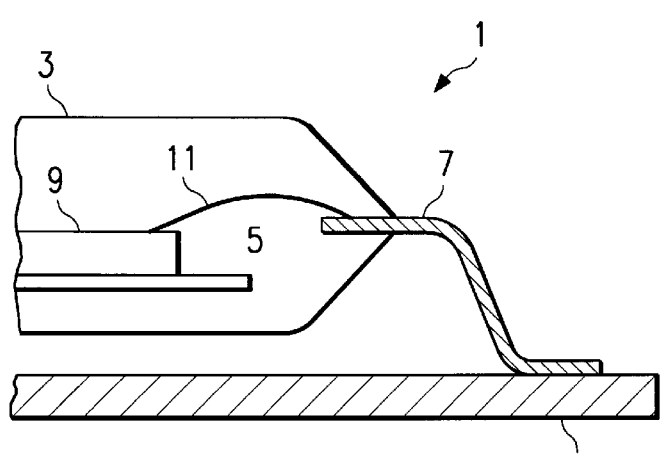
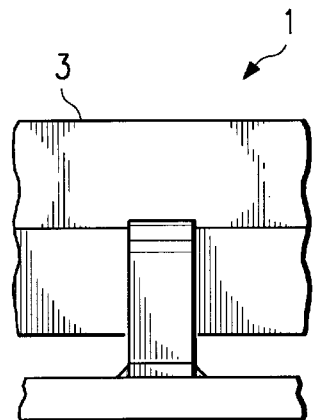
FIG. 1a (PRIOR ART)
FIG. 1b (PRIOR ART)
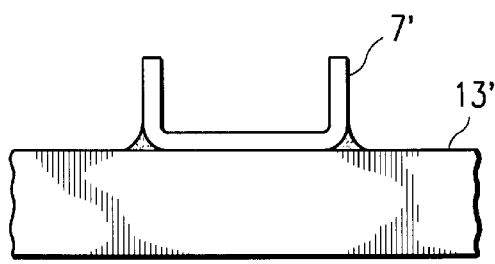
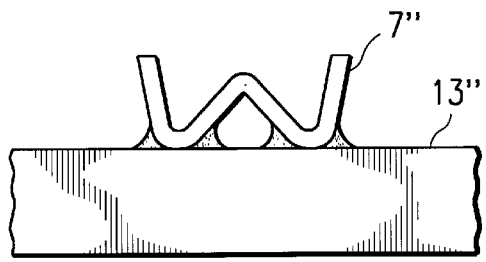
FIG. 2
FIG. 3
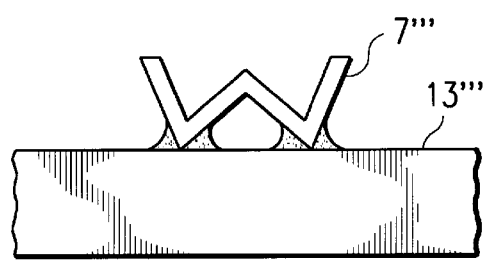
FIG. 4

REINFORCED THIN LEAD FRAMES AND LEADS

This application claims priority under 35 USC § 119(e)(1) of provisional application No. 60/034,299 filed Dec. 18, 1996.

BACKGROUND OF THE INVENTION

1. Field of the Invention

This invention relates to lead frames and lead frame leads and, more specifically, to such lead frame leads that are reinforced.

2. Brief Description of the Prior Art

Prior art semiconductor packages generally include an encapsulant, generally plastic, within which is disposed a thin flat lead frame having thin flat leads extending out of the package. A semiconductor chip is secured to the lead frame with wires bonded between pads on the chip and the thin flat leads of the lead frame, all within the encapsulant. The thin flat leads that extend from the encapsulant and form a part of the package are generally connected to printed circuit boards or the like, generally by soldering. In order to make such connections, it is necessary that the thin flat leads be present and it is also necessary that the thin flat leads be sufficiently rigid to lie against the surface to which they are to be attached or connected.

With the present move toward ever thinner semiconductor packages, it has become essential that the lead frames utilized in the fabrication of such thinner semiconductor packages also become thinner. Due to this thinning of the lead frames, the flat leads extending out of the encapsulant and even the body of the lead frame itself have displayed a tendency not to lie flat during packaging. This failure to lie flat has also caused a problem during a later attachment operation because the thin flat leads extending out of the encapsulant are not sufficiently rigid to insure that they remain in contact with the surface to which they are to be attached. This causes a problem during, for example, a soldering operation in that the solder is often unable to secure the lead to the surface to which it is to be soldered. In addition, the flat leads have also had a tendency to break off, thereby resulting in a yield loss for this reason as well.

SUMMARY OF THE INVENTION

In accordance with the present invention, the above noted problems of the prior art are minimized and there is provided a lead frame having reinforced leads.

Briefly, the reinforcement is accomplished by providing lead frame leads having a geometrical shape having a dimension in a direction normal to the plane of the lead frame body. The preferred lead shape is that of a "U", though other shapes can be used, such as for example, an odd number of half cycles of a sinusoid, preferably one and one half cycles of a sine wave shape, a triangle shape, etc. The shaping can be provided by adding an extra stamping operation during lead frame fabrication and during or subsequent to formation of the prior art lead frame.

The imposition of the extra dimension to the shape of the lead frame leads provides rigidity to these elements not available when the lead frame leads are flat and have an essentially two dimensional geometry as in the prior art. This rigidity also minimizes breakage of the lead frame leads, resulting in higher ultimate yields and/or greater efficiency in fabrication. In addition, the two dimensional shape improves, attachment to the printed circuit boards to which attachment is to be made by improving solderability and capillary attraction in the corners to provide a good fillet.

BRIEF DESCRIPTION OF THE DRAWINGS

FIG. 1a is a cross sectional view of a semiconductor package attached to a printed circuit board attachment region in accordance with the prior art;

FIG. 1b is an end view of the package of FIG. 1a in accordance with the prior art;

FIG. 2 is a cross sectional view in accordance with a first embodiment of the present invention taken along a line normal to the axis of the lead frame lead 7 of FIG. 1a and 1b;

FIG. 3 is a cross sectional view in accordance with a second embodiment of the present-invention taken along a line normal to the axis of the lead frame lead 7 of FIG. 1a and 1b; and FIG. 4 is a cross sectional view in accordance with a third embodiment of the present invention taken along a line normal to the axis of the lead frame lead 7 of FIG. 1a and 1b.

DESCRIPTION OF THE PREFERRED EMBODIMENTS

Referring first to FIG. 1a and 1b, there is shown a semiconductor package 1 in accordance with the prior art. The semiconductor package includes a lead frame lead 7 attached to an attachment location 13 on a printed circuit board, such as by soldering. The semiconductor package 1 includes an encapsulant 3, generally of plastic, with a lead frame body 5 disposed within the encapsulant and lead frame leads 7 extending out of the encapsulant and onto the attachment location 13. A semiconductor chip 9 is secured to the lead frame body 5 and a wire 11 is disposed within the encapsulant and bonded between a pad on the semiconductor chip and the lead frame lead 7. The lead frame lead 7 is flat and has a cross section in a direction normal to the axis of the lead which is almost one dimensional, being essentially a straight line having a length dimension and a very thin width dimension such that the lead 7 is very fragile, easily broken off and lacks rigidity to the extent that it is difficult to position and retain its position for later operation thereon.

Referring now to FIG. 2, there is shown a first embodiment in accordance with the present invention wherein the cross section of the lead frame lead extends in a direction out of as well as in the plane of the prior art lead frame lead. As can be seen, the shape of the lead frame lead 7' has been made in the shape of a "U" with a slight upturn at the opposing edges of the lead cross section. The lead frame lead 7' is secured to attachment location 13' in standard manner.

Referring now to FIG. 3, there is shown a second embodiment in accordance with the present invention wherein the cross section of the lead frame lead extends in a direction out of as well as in the plane of the prior art lead frame lead. As can be seen, the shape of the lead frame lead 7" has been made in the shape of one and one-half cycles of a sine wave. The lead frame lead 7" is secured to attachment location 13" in standard manner.

Referring now to FIG. 4, there is shown a third embodiment in accordance with the present invention wherein the cross section of the lead frame lead extends in a direction outof as well as in the plane of the prior art lead frame lead. As can be seen, the shape of the lead frame lead 7''' has been made in the shape of a "W" or three connected triangle extending in alternately opposite directions. The lead frame lead 7''' is secured to attachment location 13''' in standard manner.

Though the invention has been described with respect to specific preferred embodiments thereof, many variations and modifications will immediately become apparent to those skilled in the art. It is therefore the intention that the appended claims be interpreted as broadly as possible in view of the prior art to include all such variations and modifications.

I claim:

1. A method of making a lead frame comprising the steps of:

(a) providing a planar lead frame having a lead frame body and essentially two dimensional lead frame leads having a minimal thickness relative to their length and width dimension and having a pair of opposed major edges; and (b) forming said lead frame leads to extend out of the plane of said lead frame body at at least their opposed major edges; wherein the cross section of said lead frame leads is essentially a sinusoidal shape having an odd number of half cycles numbering at least three.

2. A method of making a lead frame comprising the steps of:

(a) providing a planar lead frame having a lead frame body and essentially two dimensional lead frame leads having a minimal thickness relative to their length and width dimension and having a pair of opposed major edges; and (b) forming said lead frame leads to extend out of the plane of said lead frame body at at least their opposed major edges; wherein the two dimensional cross section is essentially in the shape of a "W".

3. A lead frame comprising:

(a) a planar lead frame body and essentially two dimensional lead frame leads extending from said lead frame body having a minimal thickness relative to their length and width dimensions and having a pair of opposed edges;

(b) said lead frame leads extending out of the plane of said lead frame body at at least their opposed major edges; wherein the cross section of said lead frame leads is essentially a sinusoidal shape having an odd number of half cycles numbering at least three.

4. A lead frame comprising:

(a) a planar lead frame body and essentially two dimensional lead frame leads extending from said lead frame body having a minimal thickness relative to their length and width dimensions and having a pair of opposed edges;

(b) said lead frame leads extending out of the plane of said lead frame body at at least their opposed major edges; wherein said two dimensional cross section is essentially in the shape of a "W".

5. A semiconductor package comprising:

(a) a lead frame comprising:

(i) a planar lead frame body and essentially two dimensional lead frame leads extending from said lead frame body having a very small thickness relative to its length and width dimensions and having a pair of opposed major edges;

(ii) said lead frame leads extending out of the plane of said lead frame body at at least their major edges;

(b) a semiconductor chip disposed on said lead frame body; and (c) an encapsulant encapsulating said lead frame body said semiconductor chip and a portion of said lead frame leads, a portion of said lead frame leads, extending external to said encapsulant; wherein the cross sectional shape of said lead frame leads is an essentially sinusoidal shape having an odd number of half cycles numbering at least three.

6. The semiconductor package of claim 5 wherein said sinusoidal shape comprises one and one half cycles of said sinusoidal shape.

7. A semiconductor package comprising:

(a) a lead frame comprising:

(i) a planar lead frame body and essentially two dimensional lead frame leads extending from said lead frame body having a very small thickness relative to its length and width dimensions and having a pair of opposed major edges;

(ii) said lead frame leads extending out of the plane of said lead frame body at at least their major edges;

(b) a semiconductor chip disposed on said lead frame body; and (c) an encapsulant encapsulating said lead frame body, said semiconductor chip and a portion of said lead frame leads, a portion of said lead frame leads extending external to said encapsulant; wherein said two dimensional cross section is essentially in the shape of a "W".

8. The semiconductor package of claim 5 wherein said portion of said lead frame leads extending out of said encapsulant includes a bend therein, said opposed major edges extending in a direction away from said lead frame body.

9. The semiconductor package of claim 6 wherein said portion of said lead frame leads extending out of said encapsulant includes a bend therein, said opposed major edges extending in a direction away from said lead frame body.

* * * * *